United States Patent [19]

Kageyama et al.

[11] Patent Number: 4,521,735
[45] Date of Patent: Jun. 4, 1985

[54] BATTERY VOLTAGE LEVEL DETECTING APPARATUS

[75] Inventors: Yoshikazu Kageyama, Moriguchi; Sakon Nagasaki, Katano; Mineo Mino, Hirakata, all of Japan

[73] Assignee: Matsushita Electric Industrial Co., Ltd., Osaka, Japan

[21] Appl. No.: 436,351

[22] Filed: Oct. 25, 1982

[30] Foreign Application Priority Data

Oct. 28, 1981 [JP] Japan .............................. 56-173510
Oct. 19, 1982 [JP] Japan .............................. 57-183953

[51] Int. Cl.³ ............................................ G01N 27/46
[52] U.S. Cl. .................................... 324/433; 324/426
[58] Field of Search ............... 324/426, 433, 428, 427, 324/429, 434, 436; 340/636; 320/30, 31, 48

[56] References Cited

U.S. PATENT DOCUMENTS 4,114,083 9/1978 Benham et al. ..................... 340/636
4,394,741 7/1983 Lowndes ............................. 324/427

Primary Examiner—Michael J. Tokar
Assistant Examiner—Kevin D. O'Shea
Attorney, Agent, or Firm—Stevens, Davis, Miller & Mosher

[57] ABSTRACT

A battery voltage level detecting apparatus makes possible the detection of the voltage level of a battery and the detection of a minimum operating voltage by means of a single comparison circuit and a single adjustment. A voltage varying with variation of the battery voltage is compared with an output voltage of a counter for counting reference clocks so as to control the counting operation. When a change occurs in the comparison result, a battery voltage level storage command is generated, and then the counter is preset. In response to the command, the count value is stored and displayed.

8 Claims, 4 Drawing Figures

BATTERY VOLTAGE LEVEL DETECTING APPARATUS

BACKGROUND OF THE INVENTION

1. Field of the Invention

This invention relates to instruments of the type using a battery and more particularly to the detection of the voltage level or remaining voltage of a battery and the detection of a minimum voltage at which such instrument is operating (hereinafter referred to as an under cut voltage $V_{UCUT}$) by means of the same circuitry thereby ensuring high quality detection of the battery voltage level without any variation.

2. Description of the Prior Art

With conventional portable VTRs, two methods have been used to detect the voltage level of a battery, namely, a pointer meter indication method and another method which detects the voltage level by applying the battery voltage to a plurality of comparators having different reference voltages. The former pointer meter indication method requires, in addition to a circuit for detecting the under cut voltage, a separate battery voltage level detecting circuit, and two kinds of adjustments, i.e., the adjustment of the pointer meter indication and the adjustment for under cut voltage detection are necessary in consideration of variations in the characteristics of component parts to be used, thereby increasing the cost of the apparatus.

FIG. 1 of the accompanying drawings shows an example of the latter prior art method using a plurality of comparators having different reference voltages. In FIG. 1, a reference voltage generating circuit 22 generates a given reference voltage $V_{ref}$ which is lower than the under cut voltage $V_{UCUT}$ from the battery voltage $V_{BATT}$ generated from a battery 21 and it comprises a resistor and a Zener diode whose forward voltage is lower than the under cut voltage. Reference voltages $V_a$, $V_b$, $V_c$ and $V_d$ of different voltage values are produced by resistor division or the like from the reference voltage $V_{ref}$ generated from the reference voltage generating circuit 22 and they are applied to comparators 24, 25, 26 and 27, respectively. It is assumed that there is a relation $V_a > V_b > V_c > V_d$. A voltage $V_e$ generated from a voltage generating circuit 23 is applied to the other terminal of the comparators 24, 25, 26 and 27, respectively. The voltage $V_e$ varies with variation of the battery voltage $V_{BATT}$ and it comprises for example a variable resistor $VR_2$ as shown in the Figure. The variable resistor $VR_2$ is adjusted so that the voltage $V_e$ becomes equal to the voltage $V_d$ when the battery voltage $V_{BATT}$ is equal to the under cut voltage $V_{UCUT}$. With this construction, the voltage $V_e$ varying with variation of the battery voltage is compared with the fixed voltages $V_a$, $V_b$, $V_c$ and $V_d$ which are different in voltage values from one another in the comparators 24, 25, 26 and 27 and the voltage level of the battery is displayed on a display device 29 through a display circuit 28 in accordance with the comparison result. On the other hand, when the output of the comparator 27 goes to a low level, it is an indication that the voltage $V_e$ is lower than the voltage $V_d$ and hence the battery voltage is lower than the under cut voltage, thereby applying a command to a mechanism control circuit 30 to disable the operation of the instrument. With this prior art method, it is necessary to use the same number of comparators as the number of resolutions of the battery voltage level and the cost of the construction is increased very greatly. Another disadvantage is that in order to effect detection with a high degree of accuracy, the voltages $V_a$, $V_b$ and $V_c$ must be adjusted and thus the construction requires a large number of man-hours.

SUMMARY OF THE INVENTION

The present invention overcomes the foregoing disadvantages of the prior art and provides an apparatus capable of detecting the voltage level of a battery accurately by means of a single comparator and a single adjustment.

DESCRIPTION OF THE PREFERRED EMBODIMENTS

An embodiment of the invention will now be described with reference to FIG. 2.

Figure 1:
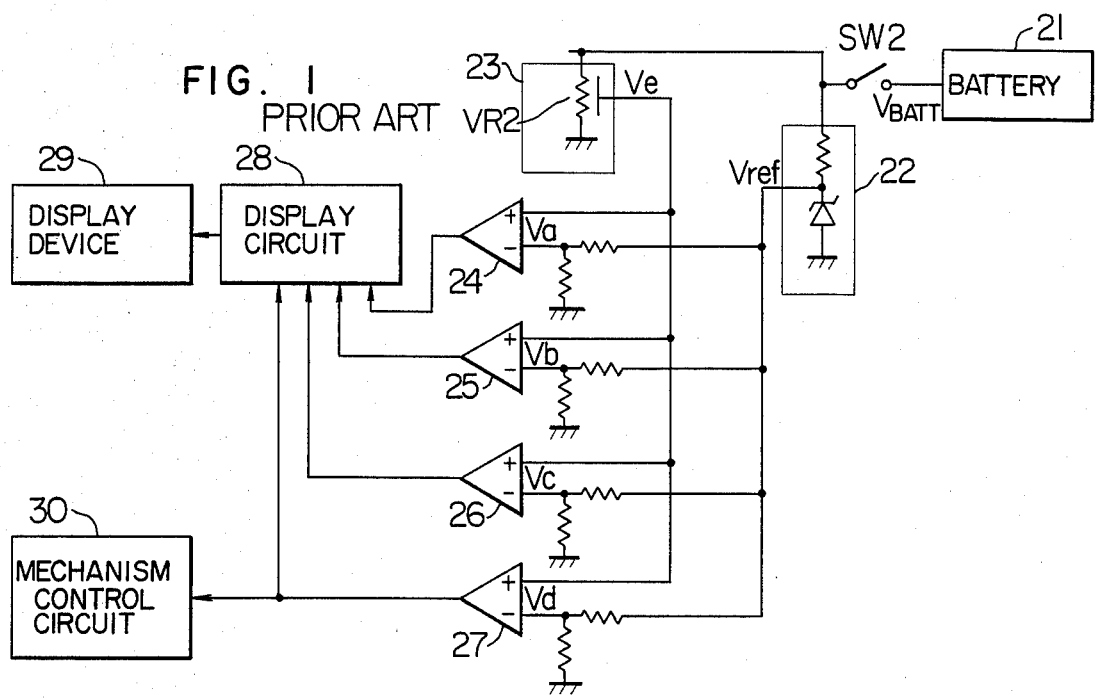
FIG. 1 is a block diagram showing shcematically the construction of a prior art apparatus.
Figure 2:
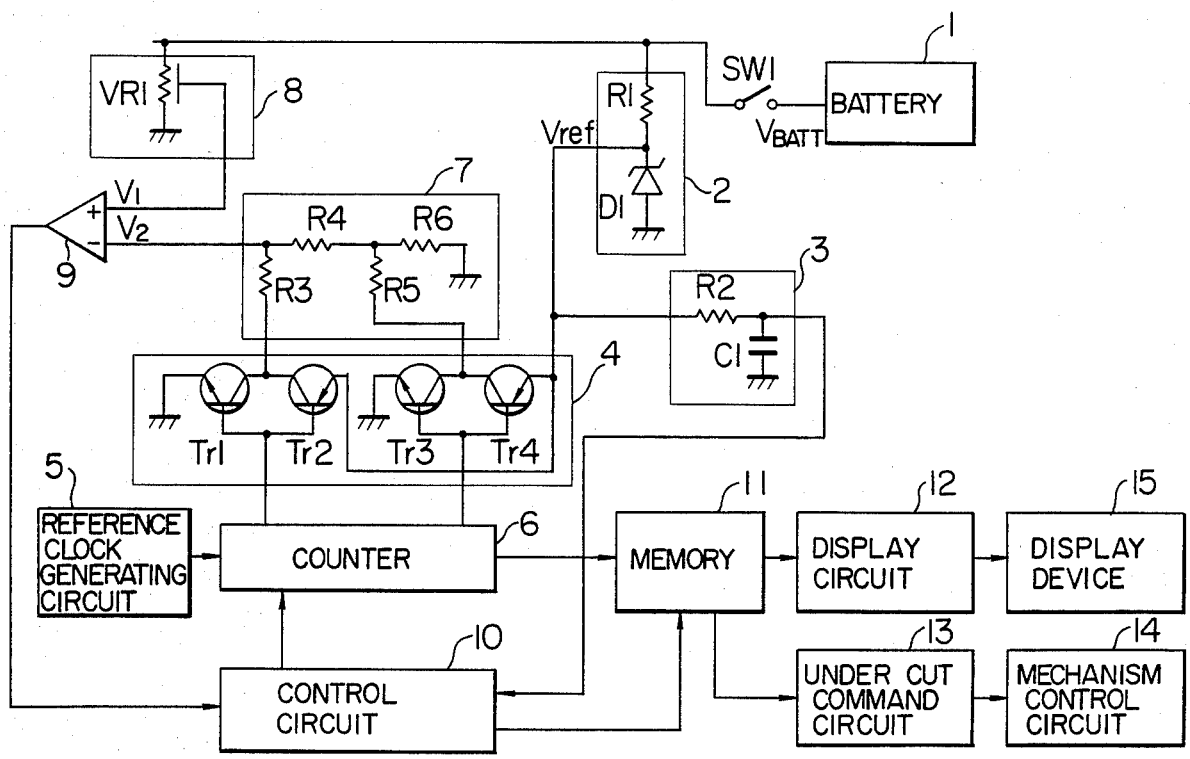
FIG. 2 is a block diagram showing schematically the construction of a battery voltage level detecting apparatus according to an embodiment of the invention.

FIG. 2 is a block diagram showing a battery voltage level detecting apparatus according to an embodiment of the invention.

For purposes of simplification of the description, the apparatus will be described with reference to a battery voltage level detecting method using a 2-bit resolution for battery voltage level by way of example.

FIG. 2 shows an example of the battery voltage level detecting system using a 2-bit battery voltage level resolution. A reference voltage generating circuit 2 is responsive to the battery voltage $V_{BATT}$ generated from a battery 1 to generate a given reference voltage $V_{ref}$ which is lower than the under cut voltage $V_{UCUT}$ and it comprises for example a resistor $R_1$ and a Zener diode $D_1$ whose forward voltage is lower than the under cut voltage $V_{UCUT}$. Thus, the reference voltage $V_{ref}$ is maintained constant under the conditions where the instrument is operating. A counter 6 is responsive to an up command or a down command from a control circuit 10 to count up or down the reference clock pulses generated from a reference clock generating circuit 5. In accordance with this embodiment, as shown in Table 1, each bit having a 0 value generates a high-level voltage and each bit having a 1 value generates a low-level voltage. The higher order bit of the counter 6 is coupled to the base of transistors $T_{r1}$ and $T_{r2}$, respectively, and the lower order bit is coupled to the base of transistors $T_{r3}$ and $T_{r4}$, respectively.

TABLE 1

| Counter value | | Counter output voltage | | Output voltage of voltage conversion circuit | | |
| --- | --- | --- | --- | --- | --- | --- |
| Higher order bit | Lower order bit | Higher order bit | Lower order bit | $T_{r1}$ collector voltage | $T_{r3}$ collector voltage | $V_2$ |
| 0 | 0 | H | H | 0 | 0 | 0 |
| 0 | 1 | H | L | 0 | $V_{ref}$ | $V_a$ |
| 1 | 0 | L | H | $V_{ref}$ | 0 | $V_b$ |
| 1 | 1 | L | L | $V_{ref}$ | $V_{ref}$ | $V_c$ |

H: high-level voltage
L: low-level voltage
$V_c > V_b > V_a$

A voltage conversion circuit 4 converts the count output of the counter 6 to a zero voltage or the reference voltage $V_{ref}$ and it comprises for example the four transistors $T_{r1}$, $T_{r2}$, $T_{r3}$ and $T_{r4}$ as shown in FIG. 2. A D-A conversion circuit 7 subjects the output value of the voltage conversion circuit 4 to D-A conversion to generate a voltage $V_2$ and it comprises for example resistors $R_3$, $R_4$, $R_5$ and $R_6$ which are connected in the form of a ladder as shown in FIG. 2. Their resistance values are selected so that $R_3 = R_5 = R_6 = 2 \times R_4$. A voltage generating circuit 8 generates a voltage $V_1$ which varies in accordance with variation of the battery voltage $V_{BATT}$ and it comprises for example a variable resistor $VR_1$ as shown in FIG. 2 thus making it adjustable. A comparison circuit 9 compares the values of the voltages $V_1$ and $V_2$ and generates the result. Thus, in FIG. 2, a high voltage is generated when the voltage $V_1$ is higher than the voltage $V_2$ and a low voltage is generated when the voltage $V_1$ is lower than the voltage $V_2$. The comparison circuit 9 may be constructed to generate the voltages in the reverse manner. A control circuit 10 begins the detection of the battery voltage level when the output voltage of a delay circuit 3 becomes greater than a battery voltage level detection starting voltage preset in the control circuit 10. When the condition is establishd for starting the detection of the battery voltage level, the control circuit 10 presets the counter 6 and then reads the output voltage of the comparison circuit 9 thereby sending an up command or a down command to the counter 6 in accordance with the value of the output voltage. With the construction of FIG. 2, the up command is sent when the output of the comparison circuit 9 is a high voltage and the down command is sent when the output is a low voltage. As a result, as shown in Table 1, the value of the voltage $V_2$ is decreased when the down command is generated from the control circuit 10 and the value of the voltage $V_2$ is increased when the up command is generated from the control circuit 10. When the output voltage of the comparison circuit 9 changes its state, a battery voltage level storage command is sent to a memory 11, and then the counter 6 is again preset thereby effecting the battery voltage level detection. When the battery voltage level storage command is received from the control circuit 10, the memory 11 stores the current contents of the counter 6. A display circuit 12 displays the contents of the memory 11 on a display device 15. An under cut command circuit 13 is designed so that when the contents of the memory 11 attain a value corresponding to a value of the battery voltage $V_{BATT}$ which is lower than the under cut voltage $V_{UCUT}$, an output is sent to a mechanism control circuit 14 to disable the operation of the instrument. The reason for providing the delay circuit 3 is that when a power supply $SW_1$ is changed from the off to the on state, the delay circuit 3 prevents the battery voltage detection from being effected before the battery voltage $V_{BATT}$ reaching the under cut voltage $V_{UCUT}$ due to the rise time of the battery voltage $V_{BATT}$ is lower than under cut voltage $V_{UCUT}$. Thus, the values of circuit elements $R_2$ and $C_1$ forming the delay circuit 3 are selected such that the time interval between the time of transition from the off to the on state of the power supply $SW_1$ and the time that the output voltage of the delay circuit 3 exceeds the battery voltage level detection starting voltage is greater than the time required for the battery voltage $V_{BATT}$ to rise to the under cut voltage $V_{UCUT}$.

Next, the variation in the value of the battery voltage level detected by the above-mentioned battery voltage level detection system will be described. While the battery voltage level detection resolution is two bits in the case of FIG. 2, the variation will be calculated in accordance with the detection system using an N-bit resolution.

In accordance with the invention, the variation is calculated on the basis of a case when the battery voltage $V_{BATT}$ reaches the under cut voltage $V_{UCUT}$. As a result, assuming that "A" represents a decimal number indicating the value of the counter 6 attained upon detection that the battery voltage $V_{BATT}$ is just reaching the under cut voltage $V_{UCUT}$, the circuit element $VR_1$ of the voltage generating circuit 8 is adjusted such that the voltages $V_1$ and $V_2$ become equal in value when the counter 6 attains the decimal number A. In this case, if it is assumed that the variation of the reference voltage $V_{ref}$ due to the variation of the circuit element $D_1$ is r % and the variation of the converted voltage due to the variations of the resistors $R_3$, $R_4$, $R_5$ and $R_6$ of the D-A conversion circuit 7 is q %, then a value $V_2'$ of the voltage $V_2$ attained upon detection of the under cut voltage is given by $$V_2' = V_{ref}(1 + r/100) \frac{A}{2^n} (1 + q/100) \quad (1)$$

Also, assuming that the value of the voltage $V_1$ attains g % of the battery voltage $V_{BATT}$ through the voltage generating circuit 8, then a value $V_1'$ of the voltage $V_1$ upon detecting the under cut voltage is given by $$V_1' = V_{UCUT} \times g/100 \quad (2)$$

Since the circuit element $VR_1$ of the voltage generating circuit 8 is adjusted so that the values $V_2'$ and $V_1'$ become equal to each other, we obtain $$V_1' = V_2' \quad (3)$$

The value of g is adjusted so that it becomes as indicated by the following equation (4).

From the equations (1), (2) and (3)

$$g = \frac{100}{V_{UCUT}} V_{ref}(1 + r/100) \frac{A}{2^n} (1 + q/100) \qquad (4)$$

In this way, the circuit element $VR_1$ of the voltage generating circuit 8 is adjusted and the battery voltage level is detected in accordance with the above-described method. The level of the battery voltage $V_{BATT}$ attained when the contents of the memory 11 attain a decimal number A+m (m=0, 1, 2, . . . ) is calculated. At that time, the following equation holds.

$$V_{BATT} \times \frac{g}{100} = V_{ref}(1 + r/100) \frac{A + m}{2^n} (1 + q/100) \qquad (5)$$

Substituting the equation (4) into the equation (5) gives $$V_{BATT} = V_{UCUT} \times \frac{A + m}{A} \qquad (6)$$

As will be seen from the equation (6), the detected battery voltage level has a given value without variation.

It will be seen that in accordance with the battery voltage detecting system of this invention both the battery voltage level detection and the under cut voltage detection can be accomplished by means of the same circuitry and effecting the desired adjustment for the under cut voltage detection eliminates the necessity of making any adjustment for the battery voltage level detection and ensures the detection of the battery voltage level without variation. Thus, by increasing the resolution of the battery voltage level detection, it is possible to ensure the battery voltage level detection with a very high degree of quality.

Another embodiment of the invention will now be described with reference to FIG. 3.

Figure 3:
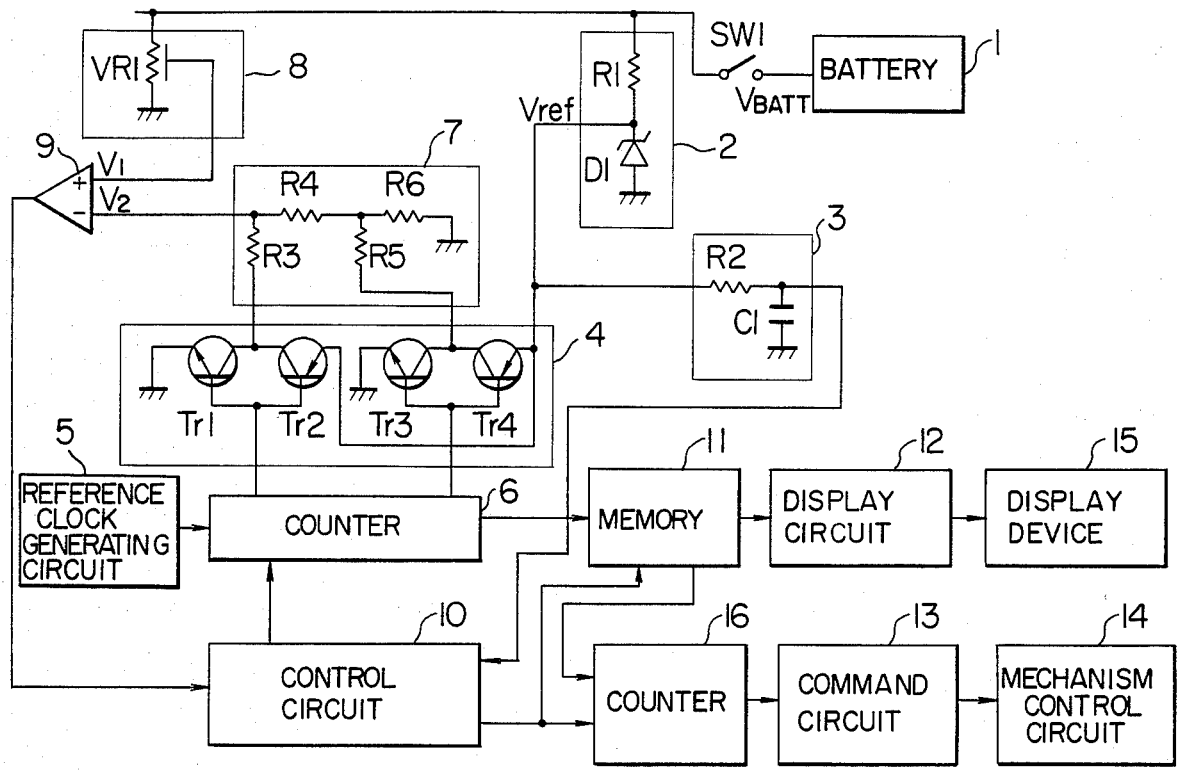
FIGS. 3 and 4 are block diagrams showing schematically the construction of other embodiments of the invention.

FIG. 3 is a block diagram of a battery voltage level detecting apparatus according to another embodiment of the invention.

The apparatus of this embodiment is based on the embodiment of FIG. 2 and shows an improvement over it. Also, for purposes of easy understanding, the same reference numerals are used for the component parts of this embodiment which are identical with those of the embodiment shown in FIG. 2. In other words, numerals 1 to 15 of FIG. 3 correspond to and designate the same component parts as the numerals 1 to 15 in the embodiment of FIG. 2.

In FIG. 3, a counter 16 counts the battery voltage level storage commands generated from the control circuit 10 and it is set to its initial value when the value of the memory 11 is one which indicates that the level of the battery voltage $V_{BATT}$ is higher than the under cut voltage $V_{UCUT}$. In other words, the counter 16 counts the number of times that the battery voltage $V_{BATT}$ is successively determined to be lower than the under cut voltage $V_{UCUT}$. Thus, when the counter 16 attains a certain value, the command circuit 13 determines that the battery voltage $V_{BATT}$ is lower than the under cut voltage $V_{UCUT}$ and sends a command to the mechanism control circuit 14 to disable the operation of the instrument. Alternatively, the command circuit 13 may generate a command to turn off the power supply $SW_1$. The reason for using the counter 16 in the under cut voltage detection is that in the steady-state condition with the battery voltage $V_{BATT}$ being higher than the under cut voltage $V_{UCUT}$, if a large load is applied momentarily (as in the case of starting a motor), there is the danger of causing the battery voltage to momentarily drop below the under cut voltage $V_{UCUT}$. This is a transient event and it should not be mistaken as indicating the drop of the battery voltage below the under cut voltage. Thus, the detection of the under cut voltage is determined only when the counter 16 successively determines a certain number of times that the battery voltage is lower than the under cut voltage.

Thus, in accordance with this embodiment both the battery voltage level detection and the under cut voltage detection can be effected by the same circuitry and the adjustment effected for the under cut voltage detection can eliminate the necessity of making any adjustment for the battery voltage level detection and allow the detection of the battery voltage level without any variation. Further, by increasing the resolution of the battery voltage level detection, it is possible to effect the battery voltage level detection with a very high degree of quality and accuracy. Also, the occurrence of any erroneous under cut voltage detection is prevented.

Figure 4:
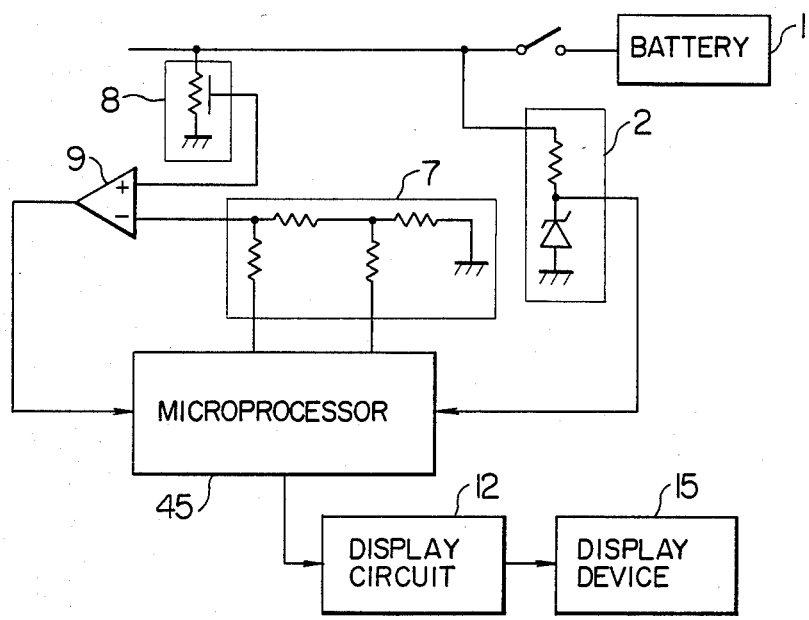

The above-described two embodiments may be simplified in construction as shown in FIG. 4 by utilizing the microprocessor used in the mechanism control circuit of a VTR. More specifically, as shown in FIG. 4, the clock generating circuit 5, the counter 6, the control circuit 10, the memory 11, the counter 16 and the command circuit 13 which are shown in FIG. 3 can be incorporated easily in the program of a microprocessor 45 and also the voltage conversion circuit 4 can be incorporated in the microprocessor 45 so as to generate a high-level output or a low-level output therefrom. Also, the delay circuit 3 can be replaced by the program by disabling the battery voltage level detection for a given time period upon application of a voltage to the microprocessor 45.

From the foregoing description it will be seen that in accordance with the present invention the voltage level of a battery can be detected with a high degree of accuracy by means of a simple construction and moreover this requires only a single adjustment.

Further, by utilizing the microprocessor used in an instrument, it is possible to construct a battery voltage level detecting apparatus practically without increasing the number of component parts.

We claim:

1. A battery voltage level detecting apparatus comprising:
    a reference voltage generating circuit for generating a predetermined reference voltage unequal to zero voltage and lower than a preselected minimum voltage capable of enabling a load instrument;
    a battery voltage detecting circuit connected to a battery for generating a battery detection voltage varying in correspondence to a variation in the voltage of said battery;
    a reference clock generating circuit for generating reference clock pulses;
    a control circuit receiving said references voltage, said control circuit generating first and second control signals;
    a counter responsive to said first control signal to count up or down in synchronism with said reference clock pulses and generate count output signals;

a voltage conversion circuit, responsive to the outputs of said counter and said reference voltage generating circuit, for converting said count output signals to a corresponding digital output signal composed of either a zero voltage or said reference voltage;

a D-A conversion circuit for converting said digital output signal to a corresponding analog output voltage;

a comparison circuit for comparing said battery detection voltage of said battery voltage detecting circuit and said analog output voltage of said D-A conversion circuit to generate a high or low level output signal;

said control circuit being responsive to said high or low level output signal to generate said first control signal and responsive to the changeover of said high or low level output signal between the high and low levels to generate said second control signal and then preset said counter;

a memory circuit connected to said counter and said control circuit and responsive to said second control signal to store data to the count value of said counter; and a display circuit for displaying said stored data of said memory circuit on a battery voltage level display device.

2. An apparatus according to claim 1, further comprising a delay circuit for delaying the output voltage of said reference voltage generating circuit applied to said control circuit.

3. An apparatus according to claim 1, wherein said battery-voltage detecting circuit is adjustable whereby said battery detection voltage is adjusted to compensate for a variation in the detection of a battery voltage level due to variations of circuit elements forming said D-A conversion circuit and variations of circuit elements forming said reference voltage generating circuit.

4. A battery voltage level detecting apparatus comprising:

a reference voltage generating circuit for generating a predetermined reference voltage unequal to zero voltage and lower than a preselected minimum voltage capable of enabling a load instrument;

a battery voltage detecting circuit connected to a battery for generating a battery detection voltage varying in correspondence to a variation in the voltage of said battery;

a reference clock generating circuit for generating reference clock pulses;

a control circuit receiving said reference voltage, said control circuit generating first and second control signals;

a first counter responsive to said first control signal to count up or count down in synchronism with said reference clock pulses and generate count output signals;

a voltage conversion circuit, responsive to the outputs of said first counter and said reference voltage generating circuit, for converting said count output signals to a corresponding digital output signal composed of either a zero voltage or said reference voltage;

a D-A conversion circuit for converting said digital output signal to a corresponding analog output voltage;

a comparison circuit for comparing said battery detection voltage of said battery voltage detecting circuit and said analog output voltage of said D-A conversion circuit to generate a high or low level output signal;

said control circuit being responsive to said high or low level output signal to generate said first control signal and responsive to the changeover of said high or low level output signal between the high and low levels to generate said second control signal and then preset said first counter;

a memory circuit connected to said first counter and said control circuit and responsive to said second control signal to store data of the count value of said first counter; and a display circuit for displaying said stored data of said memory circuit on a battery voltage level display device;

a second counter for counting a number of said second control signals generated from said control circuit, said second counter being set to an initial value, while the stored data of said memory circuit is a value indicating that said instrument can operate; and a command circuit for disabling the operation of said instrument when said second counter attains a given value.

5. An apparatus according to claim 4, wherein said command circuit is connected to means for turning off a battery when said counter attains said given value.

6. An apparatus according to claim 4, further comprising a delay circuit for delaying the output voltage of said reference voltage generating circuit applied to said control circuit.

7. An apparatus according to claim 4, wherein said battery-voltage detecting circuit is adjsutable whereby said battery detection voltage is adjusted to compensate for a variation in the detection of a battery voltage level due to variations of circuit elements forming said D-A conversion circuit and variations of circuit elements forming said reference voltage generating circuit.

8. A battery voltage level detecting apparatus comprising:

a reference voltage generating circuit for generating a predetermined reference voltage unequal to zero voltage and lower than a preselected minimum voltage capable of enabling a load instrument;

a battery voltage detecting circuit for generating a battery detection voltage varying in correspondence to a variation in the voltage of said battery;

microprocessor means, connected to said reference voltage generating circuit, for generating reference clock pulses, and first and second circuit control signals, said microprocessors counting up or counting down in synchronism with the reference clock pulses in response to said first control signal, and converting the counted number of said clock pulses to a corresponding digital output signal composed of either a zero voltage or said reference voltage;

D-A conversion means for converting said digital output signal to a corresponding analog output voltage;

comparing means for comparing said battery detecting voltage and said analog output voltage to generate a high or low level output signal;

said microprocessor means being responsive to said high or low level output signal to generate said first control signal to cause the count-up or count-down operation and being responsive to the changeover of said high or low level output signal to generate said second control signal for a battery voltage level storage command;

memory means responsive to said second control signal to store data of the clock pulse count value of said microprocessor means; and a display circuit for displaying the stored data of said memory means.

* * * * *